United States Patent [19]

Stoffel

[11] 4,287,661
[45] Sep. 8, 1981

[54] METHOD FOR MAKING AN IMPROVED POLYSILICON CONDUCTOR STRUCTURE UTILIZING REACTIVE-ION ETCHING AND THERMAL OXIDATION

[75] Inventor: Axel Stoffel, Wildberg, Fed. Rep. of Germany

[73] Assignee: International Business Machines Corporation, Armonk, N.Y.

[21] Appl. No.: 134,039

[22] Filed: Mar. 26, 1980

[51] Int. Cl.³ .................... H01L 21/20; H01L 21/306
[52] U.S. Cl. ......................................... 29/571; 29/578; 29/580; 29/591; 148/174; 148/187; 156/628; 156/643; 156/653; 156/657; 204/192 S; 204/192 D; 204/192 E; 357/23; 357/59
[58] Field of Search .................. 29/571, 578, 580, 591; 148/174, 187; 156/628, 643, 653, 657, 662; 204/192 S, 192 D, 192 E; 357/23, 59

[56] References Cited

U.S. PATENT DOCUMENTS

| | | | |
|---|---|---|---|
| 3,900,350 | 8/1975 | Appels et al. | 29/578 X |
| 3,906,620 | 9/1975 | Anzai et al. | 29/571 |
| 3,961,999 | 6/1976 | Antipov | 148/174 X |
| 3,972,756 | 8/1976 | Nagase et al. | 357/23 X |
| 4,080,719 | 3/1978 | Wilting | 29/578 X |
| 4,104,086 | 8/1978 | Bondur et al. | 29/578 X |
| 4,139,442 | 2/1979 | Bondur et al. | 156/643 X |
| 4,211,582 | 7/1980 | Horng et al. | 204/192 E |
| 4,234,362 | 11/1980 | Riseman | 29/571 X |

Primary Examiner—L. Dewayne Rutledge
Assistant Examiner—William G. Saba
Attorney, Agent, or Firm—George O. Saile

[57] ABSTRACT

A method is described for eliminating abnormalities in a polycrystalline silicon integrated circuit structure, such as a silicon gate field effect transistor structure. The layer of polysilicon is deposited on an insulator coating which may be the thickness of the gate dielectric. The polycrystalline silicon is delineated by lithographic techniques and a reactive ion etching process to form the desired conductor structure which would include gate electrodes for the field effect transistor structure. A thickness of the polycrystalline silicon of the order of hundreds of Angstroms is left upon the insulator coating where the masking layer has openings. This thin coating of polycrystalline silicon in the order of hundreds of Angstroms is then thermally oxidized together with the exposed sidewall of the polycrystalline silicon in the areas under the opaque parts of the masking layer to form silicon dioxide on the sidewall of the polycrystalline silicone structures. A directional reactive ion etching of the silicon dioxide removes all silicon dioxide formed by the thermal oxidation step from the horizontal silicon substrate while leaving the silicon dioxide on the vertical sidewall regions. The method prevents the formation of a poor grade of silicon dioxide under the edges of the polycrystalline silicon conductor structure.

10 Claims, 8 Drawing Figures

METHOD FOR MAKING AN IMPROVED POLYSILICON CONDUCTOR STRUCTURE UTILIZING REACTIVE-ION ETCHING AND THERMAL OXIDATION

DESCRIPTION

1. Field of the Invention

The present invention relates to a method for forming an improved polycrystalline silicon conductor, and more particularly to a polycrystalline silicon structure for metal-oxide-silicon field effect transistor integrated circuits, which eliminates several construction abnormalities in presently known processes.

2. Description of Prior Art

Polycrystalline silicon has been used for various purposes in the formation of integrated circuit structures of the field effect transistor, bipolar transistor and the like. Polycrystalline silicon has been used particularly well as conductor structures wherein it has been doped with appropriate impurities to increase its conductivity. A major use has been in the double polycrystalline silicon process for metal-oxide-silicon field effect transistor integrated circuit memories. It has been found that in using the standard process that the product has had problems of yield and in uniformity of gate electrode characteristics. The integrated circuit devices have been studied by means of disection of the various layers of the products, and it has been found that abnormalities, particularly involving the field effect transistor gate dielectric oxide, are produced in the conventional process. These abnormalities in the field effect transistor gate silicon dioxide involve a poor quality of the silicon dioxide dielectric which can result in yield and electrical problems in the resulting integrated circuit device.

SUMMARY OF THE INVENTION

The object of the present invention is to provide a method for fabricating polycrystalline silicon layers for use in field effect transistor devices, bipolar transistor structures, and the like, which result in increased yield and improved electrical characteristics for the resulting products. It is particularly desired to provide a process which will improve the dielectric silicon dioxide for the gate of a field effect transistor integrated device. This improvement of the gate dielectric silicon dioxide does, in turn, increase the yield and improve the electrical characteristics of field effect transistor integrated circuit structures.

In order to achieve these objects, a layer of polycrystalline silicon is deposited upon a silicon substrate covered by an insulator coating. The insulator coating may be the gate dielectric for the resulting integrated circuit. The polycrystalline silicon is then masked in areas where the conductor structure is desired. A reactive ion etching of the polycrystalline silicon in the unmasked areas is accomplished until a thickness of the polycrystalline silicon in the order of hundreds of Angstroms remains on the insulated coating is reached. The unmasked polycrystalline silicon of the order of hundreds of Angstroms is then thermally oxidized. This thermal oxidation totally oxidizes the polycrystalline silicon in the unmasked areas to silicon dioxide and oxidizes the polycrystalline silicon on the exposed sidewall under the mask. This oxidation step prevents the formation of a silicon dioxide wedge formation under the polycrystalline silicon located under the mask. This wedge of silicon dioxide which had been formed in the standard process is a poor quality silicon dioxide which has negative effects on the yields and electrical characteristics of the resulting integrated circuit structures. A directional reactive ion etching process is then utilized so that the silicon dioxide is removed from the horizontal silicon body while leaving the silicon dioxide on the vertical sidewall regions of the polycrystalline silicon conductors.

DESCRIPTION OF THE PREFERRED EMBODIMENTS

Figure 1:
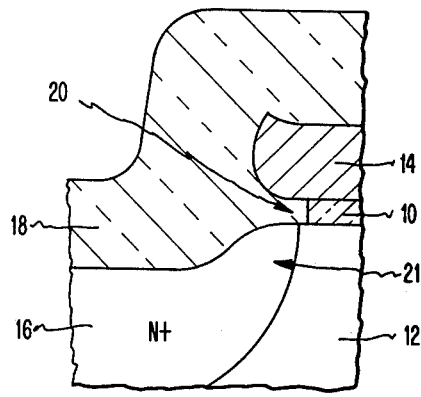
FIG. 1 is a drawing of a polycrystalline silicon structure of the prior art.
Figure 2:
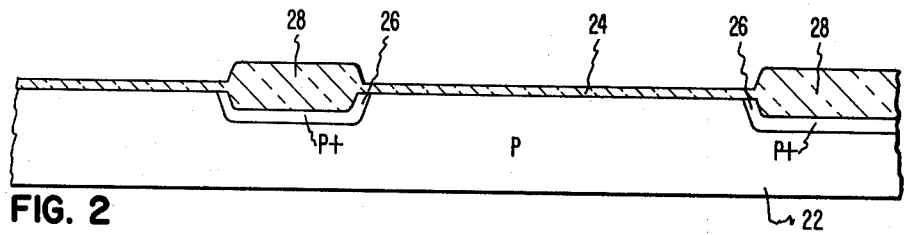
FIGS. 2 through 7 illustrate the process of the present invention for producing a double polycrystalline silicon field effect transistor device structure.

Referring now more particularly to FIG. 1 which shows the resulting detailed structure of the standard process for making a polycrystalline silicon device structure. In that process, an insulating coating 10 of silicon dioxide is grown on the surface of the silicon body 12. Polycrystalline silicon conductor 14 is then blanket deposited over the layer 10. A masking structure, such as silicon dioxide and photoresist combination is utilized with conventional lithographic techniques to mask the polycrystalline silicon conductor in the areas where it is desired to be maintained. Other areas of the polycrystalline silicon are open for removal. A chemical etch is used to remove this polycrystalline silicon in the unmasked areas. The silicon dioxide insulator layer 10 is then removed in certain of the unmasked areas wherein it is desired to either ion implant or diffuse a region such as N+ diffused region 16. The N+ region 16 is then formed by diffusion or ion implantation. The surface is then reoxidized by conventional thermal oxidation techniques involving a wet oxygen ambient to produce oxide layer 18. The result of these series of process steps is shown in the prior art structure of FIG. 1 wherein it is seen that a portion of the silicon above the diffused region 16 is utilized to form the silicon dioxide 18 which results in the illustrated structure. A wedge region 20 of the silicon dioxide layer 18 extends underneath the polycrystalline conductor 14. The wedge-shaped silicon dioxide structure 20 is of poorer quality than the silicon dioxide insulator gate dielectric layer 10. Also, the wing-shaped region 21 of N+ source/drain diffusions is formed by this process. It is these structures which cause yield and reduced electrical characteristics of bipolar and particularly FET integrated circuit structures.

Referring now more particularly to FIGS. 2 through 7 there is shown a process for forming a metal-oxide-silicon field effect transistor integrated circuit structure. The P substrate structure of monocrystalline silicon 22 is thermally oxidized at about 1000° C. in a suitable oxygen and/or steam atmosphere to produce a silicon dioxide layer 24. A chemical vapor deposition utilizing an ambient of nitrogen, hydrogen chloride gas, silicon hydrogen chloride (SiH$_2$Cl$_2$) and ammonia at between about 600 and 650° C. is utilized to deposit a layer of silicon nitride (not shown) onto the silicon dioxide layer 24. Conventional lithography processes are used to open the silicon substrate 22 through the silicon dioxide and silicon nitride layers in the regions where it is desired to have a recessed oxide isolation structure. These layers of silicon dioxide and silicon nitride may be removed by conventional etching techniques such as chemical wet etch, reactive ion etching or plasma etching. A P+ boron diffusion or ion implantation is utilized to form the P+ regions 26 in the area where the recessed silicon dioxide isolation is desired. The recessed oxide isolation 28 is then formed at 900° C. in an oxygen-water-nitrogen ambient. The silicon nitride layer is removed using, for example, a 10% hydrogen chloride wet chemical etch to produce the FIG. 2 structure. The thickness of the recessed oxide regions is of the order of 9000 to 12,000 Angstroms. These recessed oxide regions 28 encircle regions of monocrystalline silicon wherein it is desired to form integrated circuit devices which are isolated from one another.

The described isolation may alternatively be replaced with other device isolation structures such as back biasing of PN junction, or complete dielectric isolation. The dielectric materials may be other materials or combinations of other materials, including silicon dioxide, glass, silicon nitride and aluminum trioxide. Further, other partial dielectric isolation techniques may be utilized to form this isolation, such as that described in the process of J. A. Bondur, et al, U.S. Pat. No. 4,104,086 issued Aug. 1, 1978, and assigned to the assignee of the present patent application.

The silicon dioxide layer 24 may either be completely removed at this point or its thickness adjusted to the desired gate dielectric silicon dioxide for the first level FET gate structure. This oxidation would be typically a thermal oxidation at 950° C. using an ambient of oxygen, water and nitrogen. A coating 30 of P doped polycrystalline silicon is now deposited over the entire wafer which includes the layers 24 and 28 by using a mixture of silane and diborane in a hydrogen ambient in the temperature range of between about 500 to 1000° C. Alternatively, polycrystalline silicon can be deposited and then doped by an ion implantation process. The operative thickness of the polycrystalline silicon layer 30 is between about 1000 to 10,000 Angstroms with typically 3000 to 5000 Angstroms being preferred. Should the thickness be greater than about 10,000 Angstroms, planarity problems arise and make it difficult to fabricate high density integrated circuit devices. If the thickness is less than about 1000 Angstroms, the resistance of the polycrystalline silicon layer becomes significant to adversely affect the performance of the integrated circuit device. The preferred doping level is between about $10^{19}$ to $10^{21}$ atoms/cm$^3$.

A chemically vapor deposited silicon dioxide layer of between about 1000 and 2000 Angstroms in thickness layer 32 is deposited over the polycrystalline silicon layer. A resist layer (not shown) is then deposited over the silicon dioxide layer 32. Standard lithographic and masking techniques are then utilized to provide a mask structure in the resist layer in areas where the polycrystalline silicon conductor structure is desired. The silicon dioxide layer 32 is removed using the resist layer as the mask, and is removed in undesired areas by suitable etching techniques. The remaining silicon dioxide layer 32 is then utilized as a mask for the etching of the polycrystalline layer 30. This etching is accomplished by directional or anisotropic reactive ion etching of the polycrystalline silicon. The reactive ion etching or plasma etching environment for polycrystalline silicon etching is typically the conditions as follows: For example, chlorine-argon or carbon tetrachloride-argon atmosphere, RF parallel plate structure, about 10 microns pressure, 0.16 watts/centimeter$^2$ power density, and 10 cc/minute flow rate.

A critical part of the invention is to stop the reactive ion etching of the polycrystalline in the unmasked areas when a thickness of polycrystalline silicon in the order of hundreds of Angstroms remains on the insulator coating 24. The preferred thickness of the remaining polycrystalline silicon in the unmasked areas is between about 200 and 1000 Angstroms. It is preferred that the thickness be about of the order of 500 Angstroms. This resulting structure is shown in the FIG. 3. The resist layer (not shown) is then removed.

Figure 3:
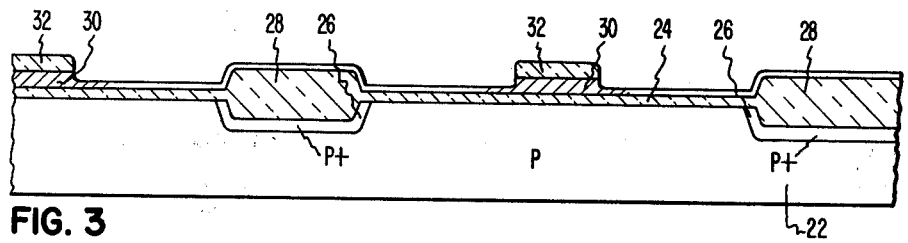
Figure 4:
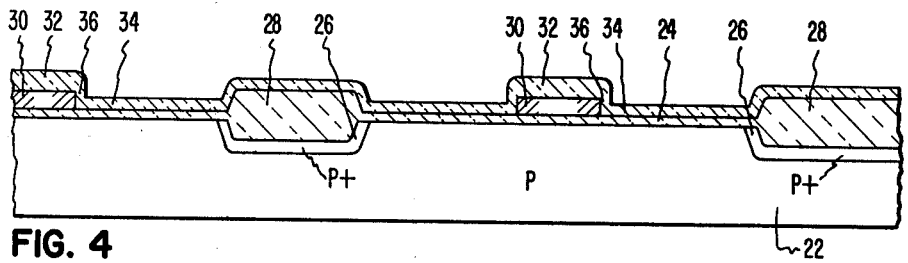

The FIG. 3 structure is then subjected to a thermal oxidation. During this oxidation the unmasked polysilicon layer 30 of the order of hundreds of Angstroms is completely converted to a thermal silicon dioxide layer 34. No oxidation will occur at the FET gate dielectric edge due to the shielding of the thickness of hundreds of Angstroms of polysilicon during this thermal oxidation. Thus, the quality of the gate dielectric is maintained at a high level. The sidewall of the polycrystalline silicon layer 30 is also converted to thermal silicon dioxide during this oxidation process. The result of this process is shown in FIG. 4.

Figure 5:
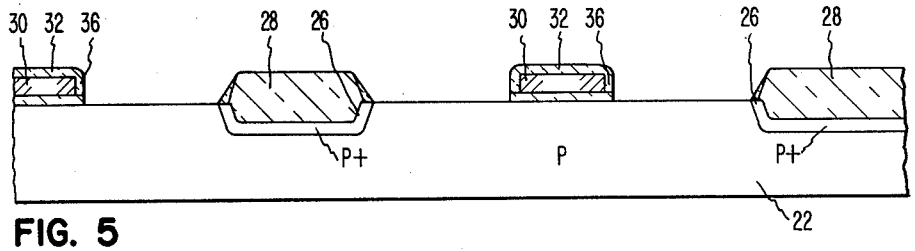

Referring now to FIG. 5, the layers 24 and 34 are etched anisotropically by a reactive ion etching process down to the silicon substrate. It is then possible to use a chemical dip etch to remove residual gate dielectric silicon dioxide. The horizontal located silicon dioxide is removed during this process, but the vertical or sidewall regions of the polycrystalline silicon gate remains substantially intact, as shown in FIG. 5.

Figure 6:
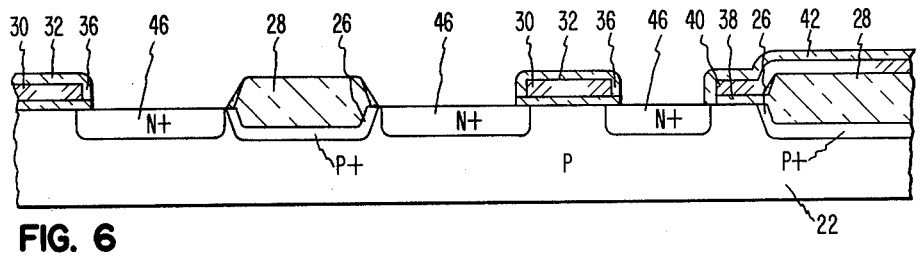

Next, the structure is subjected to a dry thermal oxidation by means of an oxygen ambient at a temperature of the order of 1000° C. This produces a substantially higher quality silicon dioxide layer 38 than does the usual wet oxygen ambient, and there is no excessive silicon dioxide growth under the gate electrode. The second layer 40 of polycrystalline silicon is deposited by the identical techniques described in regard to the first layer 30. The doping of the polycrystalline silicon layer 40 may be simultaneous with its deposition or by means of diffusion or ion implantation following the deposition. A resist layer (not shown) is utilized together with conventional lithographic techniques to provide masking for the second polycrystalline silicon conductor structure. Reactive ion etching is now accomplished isotropically to leave the polycrystalline silicon layer in unmasked areas of the order of hundreds of Angstroms. This again shields the polysilicon gate during subsequent oxidation and controls the second layer of polysilicon gate device sidewall consistent with the first level polysilicon gate construction. The resist layer is then removed. The second layer of polycrystalline silicon 40 is thermally oxidized to produce the silicon dioxide layer 42. A reactive ion etching process is used to anisotropically etch the horizontal silicon dioxide layers while allowing the vertical sidewall silicon dioxide layer to remain. The source and drain N+ regions 46 are diffused by conventional diffusion techniques, or a screen oxide of 200 Angstroms or so is put down on the surface of the regions which are designated the source and drains, and an ion implantation process plus annealing is accomplished to form the regions 46. Ion implantation is considered for the purpose of this discussion to be a specie of the broad diffusion concept. FIG. 6 shows the resulting structure.

Figure 7:
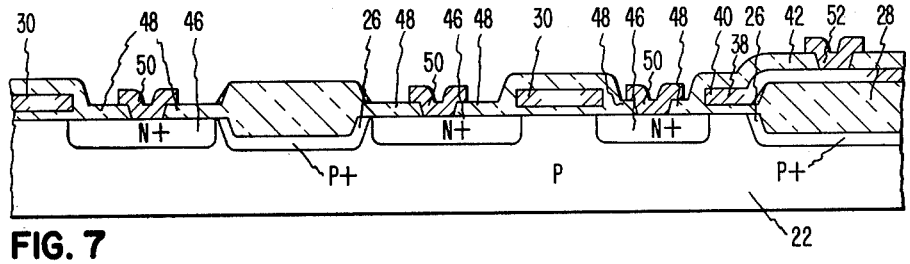

Dry oxygen oxidation is utilized to form the reoxidation layer 48 over the source/drain diffused regions 46. The dry oxidation process is utilized for the same reasons described above in regard to the first polysilicon gate structure. The contacts to the source/drain N+ diffusions 46 are made using conventional resist, lithography and etching techniques followed by a blanket deposition of a suitable contact metallurgy and further resist, lithography and etching techniques to form the desired delineated contacts 50 to the various source and drain regions. A contact 52 is shown in FIG. 7 which is deposited simultaneously with the source/drain contacts. The contact 52 contacts the second level of polycrystalline silicon.

Figure 8:
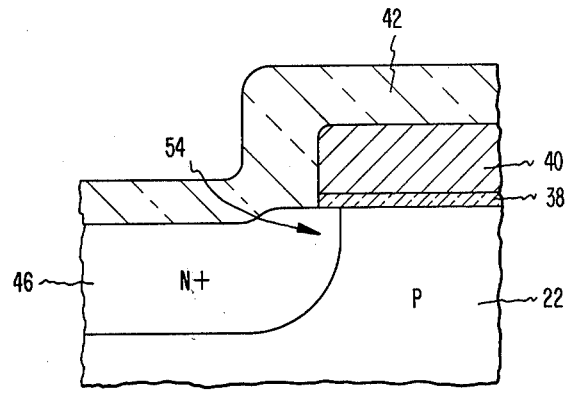
FIG. 8 is an illustration of a closeup of a portion of the FIG. 7 structure.

FIG. 8 shows a detailed view of the second polycrystalline silicon gate region of FIG. 7, similar to that shown in the prior art structure of FIG. 1. There is no silicon dioxide wedge structure, and further the wing-shaped abnormality in the diffused region at the location 54 over that of the FIG. 1 structure is much reduced.

With reference to the preferred embodiments that describe the metal-oxide-silicon field effect transistor integrated circuits, it will be understood by those skilled in the art that various changes in form and detail may be made without departing from the spirit and scope of the invention. For example, the invention is equally applicable to bipolar integrated circuit and other such structures.

Having thus described my invention, what I claim as new and desire to secure by letter patents is:

1. In a method for making an improved polycrystalline silicon conductor structure in an integrated circuit comprising:
    depositing a layer of polycrystalline silicon upon a silicon substrate covered by an insulator coating;
    masking the polycrystalline silicon in areas where said conductor structure is desired;
    reactive ion etching said polycrystalline silicon in unmasked areas until a thickness of said polycrystalline silicon of the order of hundreds of Angstroms remains on said insulator coating;
    thermally oxidizing the unmasked polycrystalline silicon whereby the said thickness on said insulator coating is totally oxidized to silicon dioxide and the exposed sidewall of polycrystalline silicon located under the mask is oxidized without causing a silicon dioxide wedge formation under the said polycrystalline silicon located under the mask; and
    directionally reactive ion etching the said silicon dioxide to remove all silicon dioxide from the horizontal silicon substrate while leaving said silicon dioxide on the vertical said sidewall regions.

2. The method of claim 1 wherein a double polycrystalline structure is formed and further comprising thermally oxidizing an exposed silicon substrate using a dry oxygen ambient to form the gate dielectric silicon dioxide layer for a second layer of polycrystalline silicon;
    depositing said second layer of polycrystalline silicon onto said silicon dioxide layer;
    masking said second layer of polycrystalline silicon in areas where said conductor structure is desired;
    reactive ion etching said second polycrystalline silicon in unmasked areas until a thickness of said polycrystalline silicon of the order of hundreds of Angstroms remains on said silicon dioxide;
    thermally oxidizing the said unmasked second polycrystalline silicon whereby the said thickness on said insulator coating is totally oxidized to silicon dioxide and the exposed sidewall of said second polycrystalline silicon located under the mask is oxidized without causing a silicon dioxide wedge formation under the said polycrystalline silicon located under the mask; and
    directionally reactive ion etching the said silicon dioxide to remove all silicon dioxide from the horizontal silicon substrate while leaving said silicon dioxide on the vertical said sidewall regions.

3. The method of claim 2 wherein the remaining portions of said polycrystalline silicon and said second layer of polycrystalline silicon are gate electrodes for metal-oxide-silicon field effect devices in said integrated circuit.

4. The method of claim 1 wherein said integrated circuit includes metal-oxide-silicon field effect devices, and further comprising diffusing into said silicon substrate in the appropriate areas to form sources and drain regions adjacent to the portions of said polycrystalline silicon which are gate electrodes for said field effect devices.

5. The method of claim 3 and further comprising diffusing into said silicon substrate in the appropriate areas to form sources and drain regions adjacent to said gate electrodes of portions of said polycrystalline silicon and said second layer of polycrystalline silicon.

6. The method of claim 1 wherein said insulator coating is silicon dioxide and is formed with the desired thickness of the gate dielectric of field effect devices to be formed in said integrated circuit.

7. The method of claim 1 wherein the said thickness of said polycrystalline silicon after said reactive ion etching is greater than about 200 Angstroms.

8. The method of claim 2 wherein the said thicknesses of said polycrystalline silicon and said second layer of polycrystalline silicon after said reactive ion etching steps are greater than about 200 Angstroms.

9. The method of claim 8 wherein said thicknesses are between about 200 and 1000 Angstroms.

10. The method of claim 1 wherein said silicon substrate contains regions of dielectric material which isolate certain regions of silicon from other regions of silicon.

* * * * *